United States Patent
Lim

(10) Patent No.: US 7,379,360 B1
(45) Date of Patent: May 27, 2008

(54) REPAIR FUSE CIRCUIT FOR STORING I/O REPAIR INFORMATION THEREIN

(75) Inventor: Kyu Hee Lim, Incheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/616,702

(22) Filed: Dec. 27, 2006

(30) Foreign Application Priority Data

Oct. 31, 2006 (KR) .................. 10-2006-0106425

(51) Int. Cl.
*G11C 8/00* (2006.01)
(52) U.S. Cl. .................. 365/200; 365/225.7
(58) Field of Classification Search .......... 365/96
See application file for complete search history.

(56) References Cited

U.S. PATENT DOCUMENTS

| | | | |
|---|---|---|---|
| 6,307,794 B1 * | 10/2001 | Haga | 365/200 |
| 6,552,937 B2 * | 4/2003 | Ladner et al. | 365/200 |
| 2006/0239074 A1 * | 10/2006 | Abedifard | 365/185.09 |

FOREIGN PATENT DOCUMENTS

KR 100170701 B1 10/1998

* cited by examiner

*Primary Examiner*—Tan T. Nguyen
(74) *Attorney, Agent, or Firm*—Townsend and Townsend and Crew LLP

(57) ABSTRACT

A repair fuse circuit includes an address comparator, and a plurality of I/O bus select bit output units. The address comparator outputs repair signals for selecting a redundant column that will replace a full column of a plurality of redundant columns according to a column address. The plurality of I/O bus select bit output units for outputting signals corresponding to respective bits of I/O bus repair signals for selecting an I/O bus to which the redundant column will be connected according to the repair signals.

10 Claims, 2 Drawing Sheets

REPAIR FUSE CIRCUIT FOR STORING I/O REPAIR INFORMATION THEREIN

CROSS-REFERENCES TO RELATED APPLICATIONS

The present application claims priority to Korean patent application number 10-2006-106425, filed on Oct. 31, 2006, which is incorporated by reference in its entirety.

BACKGROUND OF THE INVENTION

The present invention relates to a repair fuse circuit and, more particularly, to a repair fuse circuit for storing Input/Output (I/O) repair information, which can reduce the number of fuses.

In general, in a semiconductor circuit, I/O information, which will be repaired within a redundant block, is controlled using a fuse. As a chip generally operates in x8 and x16, four I/O fuse boxes are required in a repair line. Two fuses for low and high are used in one repair box.

FIG. 1 is a circuit diagram of a conventional repair fuse circuit.

A repair fuse circuit 100 includes an inverter 1100, a fuse unit F100, and a plurality of the transfer gates T110 to T140. The inverter 1100 inverts an external repair signal REP and outputs inverted repair signal IREP. The fuse unit F100 includes first to fourth fuse blocks FB110 to FB140. Each of the fuse blocks FB110 to FB140 includes a first fuse Fa connected to an input terminal to which the repair signals REP is input, and a second fuse Fb connected to a ground terminal.

Furthermore, each of the fuse blocks FB110 to FB140 outputs a logic high or a logic low depending on the open/closed state of the first and second fuses Fa, Fb with the repair signals REP. The first to fourth transfer gates T110 to T140 are turned on or off in response to the repair signal REP and the inverted repair signal IREP, and output logic signals, which are output from the first to fourth fuse blocks FB110 to FB140 to external I/O buses I/OBUS<0:3>.

The operation of the conventional redundancy I/O fuse circuit constructed above is as follows. The first or second fuses Fa, Fb within the first to fourth fuse blocks FB 110 to FB 140 is cut (or blown) through a specific test. For example, if I/O<9> is to be repaired, the second fuse Fb of each of the first and fourth fuse blocks FB 110 and FB 140 is cut (or open), and the first fuse Fa of each of the second and third fuse blocks FB 120 and FB 130 is open. Consequently, a logic signal '1001' is output through the I/O bus I/OBUS<0:3>, and a repair multiplexer (not shown) replaces a main data line, corresponding to I/O<9> with a redundancy data line according to the logic signal '1001'.

As in the above, in order to represent I/O repair information, the fuse unit F100 including eight or more fuses is required. The fuse unit F100 is used as many times as the number of repair columns. Further, in order to synchronize logic signal output from the fuse blocks FB110 to FB140 and to transfer them to the respective I/O buses I/OBUS<0:3>; it requires four transfer gates T110 to T140 including one PMOS transistor and one NMOS transistor. When the number of repair columns is 32, 256 fuses, corresponding to fuse number (8)*repair column number (32), are required.

BRIEF SUMMARY OF THE INVENTION

The present invention is directed towards a repair fuse circuit for storing I/O repair information, which can simplify a circuit and increase the level of integration by reducing the number of fuses.

In one embodiment, a repair fuse circuit includes an address comparator, and a plurality of I/O bus select bit output units. The address comparator outputs repair signals for selecting a redundant column that will replace a fail column of a plurality of redundant columns according to a column address. The plurality of I/O bus select bit output units are for outputting signals corresponding to respective bits of I/O bus repair signals and for selecting an I/O bus to which the redundant column will be connected according to the repair signals.

DESCRIPTION OF SPECIFIC EMBODIMENTS

Specific embodiments according to the present patent will be described with reference to the accompanying drawings.

Figure 1:
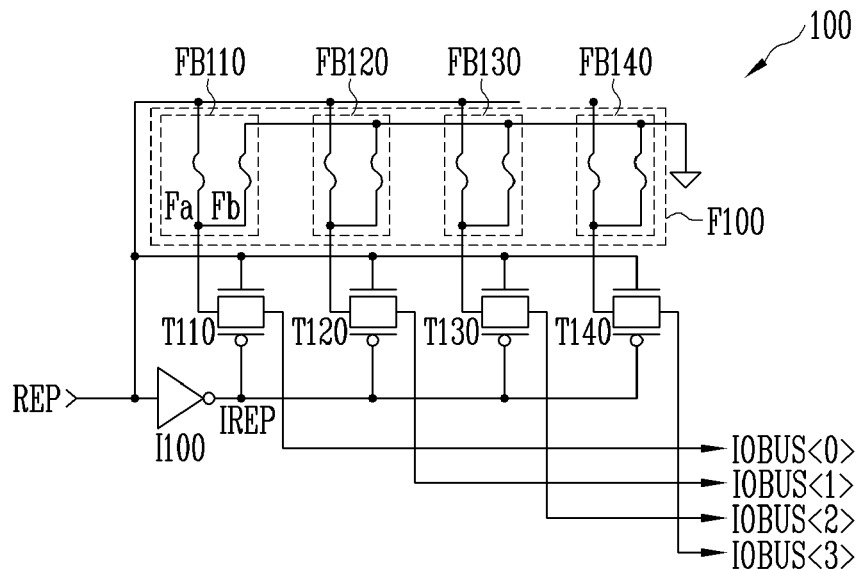
FIG. 1 is a circuit diagram of a conventional repair fuse circuit.
Figure 2:
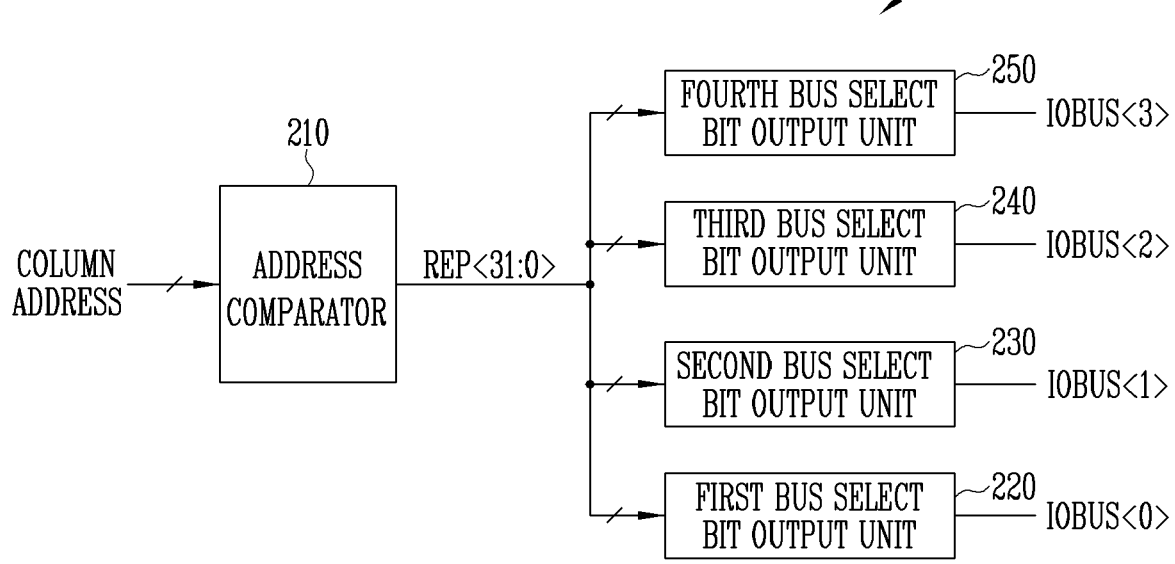
FIG. 2 is a block diagram of a repair fuse circuit according to an embodiment of the present invention.

FIG. 2 is a block diagram of a repair fuse circuit according to an embodiment of the present invention.

A repair fuse circuit 200 according to an embodiment of the present invention includes an address comparator 210 and a plurality of I/O bus select bit output units 220 to 250. The address comparator 210 outputs one of a plurality of repair signals REP<31:0> as a logic high when a column address for selecting fail columns (hereinafter, referred to as a "fail column address") is the input. The address comparator 210 also outputs the repair signals REP<31:0> as many as the number of redundant columns, which can replace fail columns.

In the present invention, an example is described in which the number of redundant columns is 32, and 32 repair signals REP<31:0> are output. It is to be noted that the number of the repair signals REP<31:0> can be changed depending on the number of redundant columns.

For example, in the case where a fail column address is input and a fail column selected by the fail column address is replaced with a third redundant column, the address comparator 210 outputs only the third repair signal REP<2> as a logic high. Which fail column will be replaced with what redundant column is stored before packaging in such a manner that a plurality of fuses are installed in the address comparator 210 and the fuses are selectively cut (or blown).

The repair signals REP<31:0> are applied to the I/O bus select bit output units 220 to 250 at the same time. The I/O bus select bit output units 220 to 250 are provided as many as the bit number of the signals I/OBUS<3:0> for selecting I/O buses connected to fail columns (hereinafter, referred to as "I/O bus repair signal") according to the repair signals REP<31:0>.

For example, when the number of I/O buses is 16 (i.e., 2⁴) a signal having four bits is required in order to select all the I/O buses. Accordingly, when the number of I/O buses is 16, four I/O bus select bit output units 220 to 250 are provided. When the number of I/O buses is 32, five I/O bus select bit output units are provided. The number of I/O bus select bit output units can be changed depending on the number of I/O buses. In the present invention, an example in which the number of I/O buses is 16 is described.

Each of the I/O bus select bit output units 220 to 250 outputs a signal corresponding to one bit of the I/O bus repair signals I/OBUS<3:0>. For example, the first I/O bus select bit output unit 220 can output the first I/O bus repair signal I/OBUS<0> corresponding to the LSB of the I/O bus repair signals I/OBUS<3:0> for selecting an I/O bus to be repaired. The second I/O bus select bit output unit 230 can output the second I/O bus repair signal I/OBUS<1> corresponding to a second lower bit of the I/O bus repair signals I/OBUS<3:0>. The third I/O bus select bit output unit 240 can output the third I/O bus repair signal I/OBUS<2> corresponding to a second upper bit of the I/O bus repair signals I/OBUS<3:0>. The fourth I/O bus select bit output unit 250 can output the fourth I/O bus repair signal I/OBUS<3> corresponding to the MSB of the I/O bus repair signal I/OBUS<3:0>.

As described above, although the same repair signals REP<31:0> are input, the first to fourth I/O bus select bit output units 220 to 250 output different bit signals of the I/O bus repair signals I/OBUS<3:0>, so that bit signals of different levels can be output. To this end, the I/O bus select bit output units 220 to 250 include fuses corresponding to the repair signals REP<31:0>, and one or more of the fuses included in the first to fourth I/O bus select bit output units 220 to 250 are selectively blown.

In other words, the number of fuses included in each of the I/O bus select bit output units 220 to 250 is the same as that of redundant columns for replacing fail columns. The first to fourth I/O bus select bit output units 220 to 250 have the same basic construction, and are described in detail below.

Figure 3:
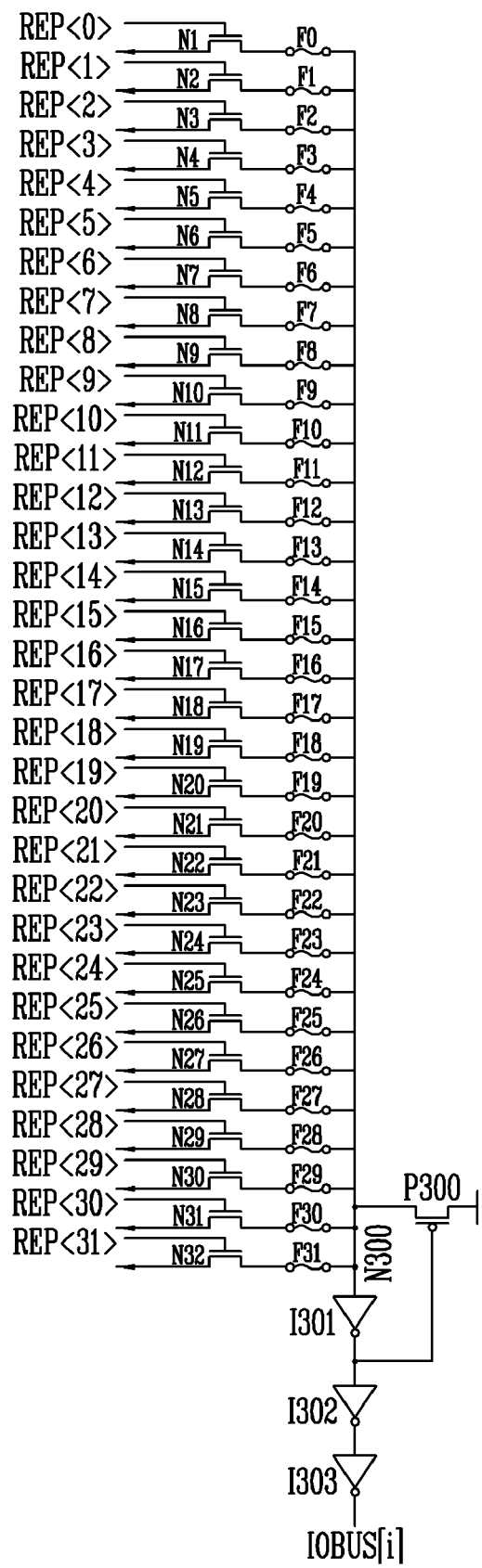
FIG. 3 is a circuit diagram of an I/O bus select bit output unit shown in FIG. 2.

FIG. 3 is a circuit diagram of an I/O bus select bit output unit shown in FIG. 2.

Referring to FIG. 3, the I/O bus select bit output unit includes a plurality of fuses F0 to F31, a plurality of switching elements N1 to N32, a transistor P300 and inverters 1301 to 1303. The number of the switching elements N1 to N32 and the number of the fuses F0 to F31 are the same as that of the repair signals REP<31:0>, that is, the number of redundant columns. The switching elements N1 to N32 are all connected to a ground terminal, and operate according to the repair signals REP<0:31>, respectively.

The switching elements N1 to N32 may be a NMOS transistor. The fuses F0 to F31 are respectively connected between a node N300 and the switching elements N1 to N32, and one of the fuses F0 to F31 is open. The transistor P300 is connected between a power supply voltage terminal and the node N300, and may be a PMOS transistor. The first inverter 1301 inverts the level of the node N300, and is applied to the gate of the transistor P300. The second and third inverters 1302 and 1303 serve as a buffer to stabilize the output signal of the first inverter 1301.

The I/O bus select bit output unit constructed above outputs one bit signal of the I/O bus signals I/OBUS<3:0> according to the repair signals REP<31:0> and a open/closed state of each of the fuses F0 to F31. An example in which a fail column is replaced with a third redundant column and the third redundant column is connected to a fifth I/O bus is described below.

In order to replace the fail column with the third redundant column, only the third repair signal REP<2> is applied as a level different from the remaining repair signals (for example, a high level). Furthermore, the third fuse F2 included in each of the second and fourth I/O bus select bit output units 230 and 250 are open, and the third fuse F3 included in each of the first and third I/O bus select bit output units 220 and 240 are closed.

The first and third I/O bus select bit output units 220 and 240 output the first and third I/O bus repair signals I/OBUS<0> and I/OBUS<2> as logic high depending on the third repair signal REP<2> and the open/closed state of the third fuse F2. The second and fourth I/O bus select bit output units 230 and 250 output the second and fourth I/O bus repair signals I/OBUS<1> and I/OBUS<3> as a logic low. The I/O bus repair signals I/OBUS<3:0> become '0101', and a fifth I/O bus is connected to a redundant column according to the signal.

The above operation is described. It is determined whether the first redundant column will be connected using which I/O bus according to the open/closed state of the first fuse F0 included in each of the first to fourth I/O bus select bit output units 220 to 250. It is also determined whether the second redundant column will be connected using an I/O bus according to the open/closed state of the second fuse F1. Furthermore, it is determined whether an $n^{th}$ redundant column will be connected using an I/O bus according to the open/closed state of $n^{th}$ fuses Fn (n is an integer).

As described above, according to the present invention, the I/O bus select bit output units including the fuses corresponding to the number of redundant columns for replacing fail columns are provided with as many as the number of the I/O bus repair signals used to select the I/O buses. If a column address for selecting a fail column is the input, the I/O bus select bit output signals corresponds to respective bits of the I/O bus repair signals. Accordingly, the number of fuses can be reduced, a circuit can be simplified, and the level of integration can be increased.

The above embodiments of the present invention are illustrative and various alternatives are possible. Other additions, subtractions, or modifications are obvious in view of the present disclosure and are intended to fall within the spirit and scope of the appended claims.

What is claimed is:

1. A repair fuse circuit, comprising:
    an address comparator to output repair signals for selecting a redundant column according to a column address, the redundant column being selected to replace a fail column and selected from a plurality of redundant columns; and
    a plurality of I/O bus select bit output units to output signals corresponding to respective bits of I/O bus repair signals for selecting an I/O bus to which the redundant column is to be connected according to the repair signals.

2. The repair fuse circuit of claim 1, wherein the address comparator outputs the repair signals corresponding to the redundant columns.

3. The repair fuse circuit of claim 2, wherein the address comparator outputs a repair signal to select a redundant column that is to replace the fail column of the redundant columns, wherein the repair signal output to select the redundant column has a different logic level than remaining repair signals.

4. The repair fuse circuit of claim 1, wherein a bit number of the I/O bus repair signal is the same as the number of the I/O bus select bit output unit.

5. The repair fuse circuit of claim 1, wherein the I/O bus select bit output unit comprises:
    a plurality of a switching elements operating according to the repair signals, respectively, and connected to a ground terminal in parallel;
    a transistor connected to a power supply voltage terminal;
    fuses, each connected between the transistor and one of the switching elements; and an inverter to invert a voltage level of a node between the transistor and the fuses and apply the voltage level to a gate of the transistor.

6. The repair fuse circuit of claim 5, wherein the fuses are installed as many as the number of redundant columns.

7. The repair fuse circuit of claim 5, wherein an I/O bus to which a $n^{th}$ redundant column is to be connected is decided according to a cutting state of a $n^{th}$ fuse of the fuses.

8. The repair fuse circuit of claim 5, further comprising a buffer connected to an output terminal of the inverter.

9. The repair fuse circuit of claim 5, wherein the switching element comprises a NMOS transistor.

10. The repair fuse circuit of claim 5, wherein the transistor comprises a PMOS transistor.

* * * * *